United States Patent [19]

Botzenhardt

[11] 3,935,635
[45] Feb. 3, 1976

[54] METHOD OF PRODUCING A SEMICONDUCTOR ARRANGEMENT
[75] Inventor: Leonhard Botzenhardt, Heilbronn, Germany
[73] Assignee: Licentia Patent-Verwaltungs-G.m.b.H., Frankfurt am Main, Germany
[22] Filed: Mar. 22, 1974
[21] Appl. No.: 453,881

[30] Foreign Application Priority Data
Mar. 29, 1973 Germany............................. 2315710

[52] U.S. Cl. ...................... 29/578; 29/590; 29/591
[51] Int. Cl.² .......................................... B01J 17/00
[58] Field of Search ............. 29/578, 589, 590, 591

[56] References Cited
UNITED STATES PATENTS
3,495,324  2/1970  Guthrie .................................. 29/578
3,556,951  1/1971  Cerniglia ............................... 29/578

Primary Examiner—W. Tupman
Attorney, Agent, or Firm—Spencer & Kaye

[57] ABSTRACT

A method of producing a semiconductor arrangement comprises electrolytically depositing a thickening onto a metal layer, at the contact points for the semiconductor arrangement, which metal layer is intended to eventually form conducting paths for the semiconductor arrangement and effectively covers the relevant semiconductor body surface.

10 Claims, 9 Drawing Figures

METHOD OF PRODUCING A SEMICONDUCTOR ARRANGEMENT

BACKGROUND OF THE INVENTION

The invention relates to a method for producing a semiconductor arrangement from a semiconductor body covered with an insulating layer on which conducting paths run and contact the regions in the semiconductor body, wherein the conducting paths are so reinforced at certain positions by electro-deposited metal that the resulting thickened contact parts in this case are suitable for wire-less contacting of the semiconductor arrangement.

Semiconductor components are connected many times with the help of the so-called "Flip-Chip-Technique" to housing connection parts in a wire-less manner. For this, for example, frame-form contacting strips are used which have a plurality of contacting tongues projecting into the frame interior extending from the contacting frame. The electrodes of the semiconductor component are then connected directly to the ends of these tongues. To facilitate the contacting method, the contacts of the semiconductor components are reinforced at the contact points. These increased contacts can comprise, for example, secured beads or electrolytically deposited projections.

If the increased contact regions, which in many places are also called contact beads, are electrolytically deposited onto the conducting paths leading to the semiconductor components, all the conducting paths must be connected to a pole of a voltage source during the deposition. All the conducting paths must thus be connected to each other during the electrolytic depositing. This is achieved in the case of a known method, in that a metal layer is applied to the semiconductor surface which metal layer short-circuits all the conducting paths. Since this metal layer has to be removed again later, in the case of the known methods the conducting paths are first covered with an oxide layer which is provided with windows in the regions provided for the electrolytic deposition. After the application of the second metal layer which is connected in the apertures of the oxide layer to the conducting paths lying thereunder, gold for example is then electrolytically deposited onto this second metal layer. So that the deposition is effected only at the places provided therefor, all the other regions of the metal intermediate layer are masked with photo lacquer (photo resist).

The known method is very expensive and involves a considerable number of sources of error. The intermediate layer as a rule comprises titanium and gold, which however adheres only very badly to the conducting paths, which in many cases, comprises aluminum. As a result of the lack of adhesion of the metal layer to the conducting paths alone, failures resulted which were of the order of magnitude of 50%.

SUMMARY OF THE INVENTION

It is an object of the invention to provide a method for producing electrolytically deposited reinforced contact parts in which the metal intermediate layer can be dispensed with.

According to a first aspect of the invention, there is provided a method for producing a semiconductor arrangement comprising the steps of applying to a semiconductor body provided with one or more regions an insulating layer defining windows for contact with said regions, applying to said semiconductor body a metal layer for forming conducting paths therein and to cover said insulating layer and said windows defined thereby, applying to said semiconductor body a masking to cover said metal layer and define windows at contact points for said semiconductor arrangement and electrolytically depositing thickening metal onto said metal layer through said windows in said masking layer.

According to a second aspect of the invention there is provided a method for producing a semiconductor arrangement from a semiconductor body covered with an insulating layer and conducting paths running on the insulating layer and contacting the regions in the semiconductor body, the conducting paths at certain points being so reinforced by electrolytically deposited metal that the thickened contact parts resulting in this case are suitable for the wire-less contacting of the semiconductor arrangement, characterized in that firstly a metal layer which is is applied over the insulating layer provided with windows at the connection points to the regions, to cover said insulating layer and said windows; in that this metal layer is covered, at said positions provided for the conducting paths, with a first masking layer, which moreover leaves uncovered parts of said metal layer provided for said thickened contact parts; in that thereafter the entire semiconductor surface, with the exception of the portions provided for said reinforced contact parts, is covered with a second masking layer; in that said thickened contact parts are deposited electrolytically on said metal layer at said portions left uncovered by the two masking layers; in that said second masking layer is again removed; and in that subsequently said metal layer is removed at the positions not covered by said first masking layer.

BRIEF DESCRIPTION OF THE DRAWINGS

The invention will now be described in greater detail, by way of example, with reference to the drawings in which.

DESCRIPTION OF THE PREFERRED EMBODIMENT

Figure 1:
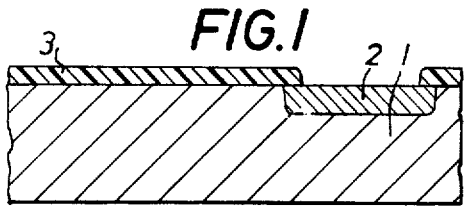
FIG. 1 shows a section through a semiconductor body showing a first stage of one form of the method according to the invention.
Figure 2:
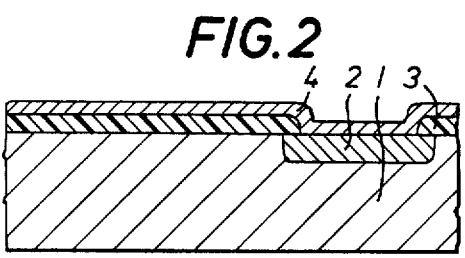
FIG. 2 is a view similar to FIG. 1 but showing a second stage of the method.

Basically, in a preferred form, the invention proposes that firstly there is applied to the insulating layer, which is provided with apertures at the connection points to the semiconductor regions a metal layer which covers the insulating layer and the apertures; that, then, the metal layer is covered at the positions provided for conducting paths with a first masking layer which moreover leaves uncovered the positions provided for the thickened contact parts of the metal layer; that thereafter the whole semiconductor surface with the exception of the positions provided for the thickened contact parts is covered with a second masking layer, that the thickened contact parts are electrolytically deposited on the metal layer at the portions not covered by both masking layers; that the second masking layer is removed; and that subsequently the metal layer, at the portions not covered by the first masking layer, is removed.

The failures can be considerably reduced by this method in accordance with the invention and the production of semiconductor components and integrated semiconductor circuits can be made cheaper by economizing on the intermediate metal layer.

In an advantageous further development of the method in accordance with the invention, the first masking layer is also removed after the production of the conducting paths. The conducting paths, are, for example, produced by etching. After the removal of the masking layer, preferably the entire surface is covered with an insulating layer, for example with a pyrolytically deposited oxide. Connection windows are made in this insulating layer only at the thickened contact parts.

In order to prevent a simultaneous removing of both masking layers, these must comprise a material which can be removed only with different media. If the masking layers comprise photo lacquer, preferably a negative lacquer is used for one layer and a positive photo lacquer is used for the other layer. The positive lacquer can be removed for example by acetone whereas the negative lacquer can be removed by cold disintegration with the help of ion technology or stripping agents available commercially.

Referring now to the drawings, in each case, only one part of a semiconductor arrangement is shown in section, since in this way all the important method steps can be shown. Attention is drawn to the fact that the method in accordance with the invention can be used for the production of semicondcutor arrangments of all kinds, particularly integrated semiconductor circuits and individual components. It can always be used if the semiconductor arrangement to be produced has to be connected to the contacting element in a wire-less manner.

FIG. 1 shows a semiconductor body 1, for example of silicon, which has a region 2. The semiconductor body and the region 2 can differ in the type of conductivity and in impurity concentration. The semiconductor surface is covered with an insulating layer 3 which is provided with a contacting window in the vicinity of the region 2. The insulating layer preferably comprises, for example, silicon dioxide. After this the semiconductor surface is covered with a metal layer 4 which extends over the insulating layer and the windows in this insulating layer. This metal layer is later to be so structured that conducting paths from the semiconductor regions extend over the insulating layer to other semiconductor regions or to contact positions or points. The metal layer 4, in accordance with FIG. 4, can comprise a plurality of individual layers arranged one on the other, which are evaporated or sputtered on in vacuo without intermediate aeration, onto the surface of the semiconductor arrangement. The lowermost layer 4a preferably comprises titanium, onto which is applied a layer 4b of molybdenum, tungsten, palladium or platinum. The uppermost layer 4c comprises, for example, gold, since the metal to be electrodeposited usually comprises gold. The thickness of the metal layer 4 amounts to, for example, from 0.6 to 1 $\mu$m.

Figure 3:
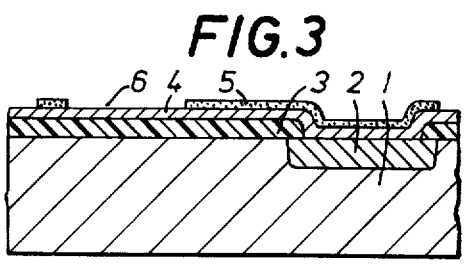
FIG. 3 is a view similar to FIG. 1 but showing a third stage of the method.

According to FIG. 3 a masking layer 5, which for example, comprises KTFR lacquer, is applied to the metal layer 4. This photo lacquer is a negative lacquer, in which after exposure and development the exposed parts remain on the surface. This photo lacquer is so exposed and developed that only the part of the metal layer 4 provided for the conduction paths remain covered. However, additionally, those parts of the metal layer 4 onto which the increased contact parts are to be electrolytically deposited, are to be excepted from the covering. This exception is given the reference numeral 6 in FIG. 3.

Figure 4:
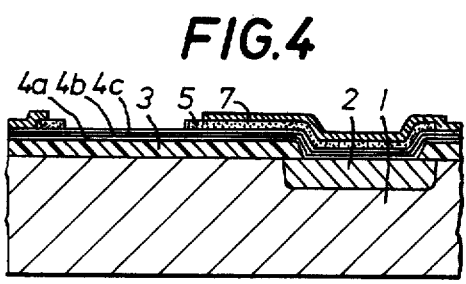
FIG. 4 is a view similar to FIG. 1 but showing a fourth stage of the method.

After this the entire surface of the semiconductor arrangement according to FIG. 4 is covered with a second masking layer 7. This masking layer has apertures only in the region 6 provided for the increased contact parts, whereas all the other parts of the surface remain covered. The masking layer 7 comprises for example AZ photo lacquer. This photo lacquer is a so-called positive photo lacquer.

Figure 5:
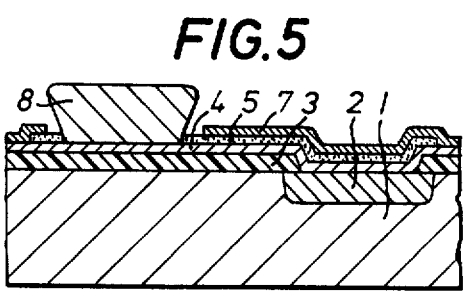
FIG. 5 is a view similar to FIG. 1 but showing a fifth stage of the method.

The unstructured metal layer 4 is now connected to the corresponding electrode in an electrolytic bath. A relatively thick contact 8 in accordance with FIG. 5 is deposited in the region 6 on the metal layer 4 in this electrolytic bath. This thickened contact part has, for example, a height of 25 $\mu$m and a lateral length of approximately 100 $\mu$m. For example, an integrated circuit has a plurality of such contact parts, which are all electrolytically deposited at the same time.

Figure 6:
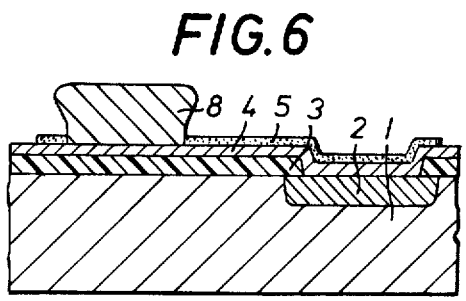
FIG. 6 is a view similar to FIG. 1 but showing a sixth stage of the method.
Figure 7:
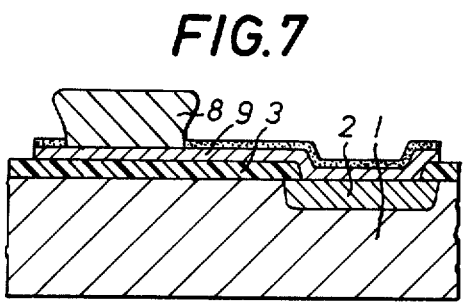
FIG. 7 is a view similar to FIG. 1 but showing a seventh stage of the method.

Now the masking layer 7 is removed in accordance with FIG. 6. This is effected in the case of a positive lacquer for example with acetone or with any other commercially available lacquer solvent. Thus the masking layer 5 is again present at the surface, which covers the parts of the metal layer 4 provided for the conducting paths. Now the uncovered parts of the metal layer 4 are removed with the help of an etching medium. For this a suitable etching medium or the ion etching method is used. In this case of this etching process of course also a little of the increased contact part 8 is attacked. But this removed portion is negligibly small in the case of the thickness of the contact parts. FIG. 7 shows, how, after the etching process, still only the conducting paths 9 remains, which, for example, connect a semiconductor region 2 to a connection contact 8 in an electrically conductive manner.

Figure 8:
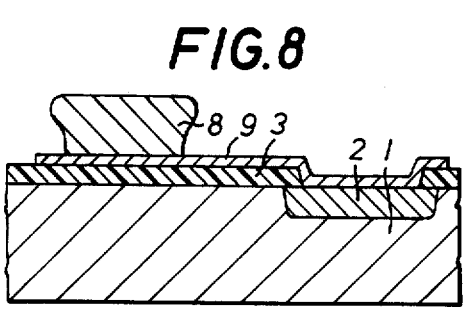
FIG. 8 is a view similar to FIG. 1 but showing an eighth stage of the method.

Now the masking layer 5 can also be removed again. If it is a question of a KTFR negative lacquer the latter is better removed by cold disintegration or a commercially available stripping agent. Then a semiconductor arrangement in accordance with FIG. 8 remains.

It has been shown to be advantageous to further cover the semiconductor arrangement with an oxide layer which keeps external influences and impurities from the semiconductor surface.

Figure 9:
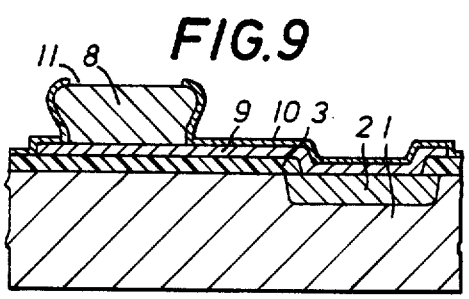
FIG. 9 is a view similar to FIG. 1 but showing a final stage of the method.

Thus, for example, in accordance with FIG. 9, a silicon dioxide layer 10 is pyrolytically deposited on the entire surface; then, still with the help of a suitable masking, exposure and etching process apertures 11 must be made over the increased contact parts in this oxide layer 10. Since the increased or higher level contact parts are, as a rule, connected with the tinned surfaces of further contacting parts, the thin oxide layer at the edge of the contact part does not prevent a good contacting, since the height difference between the surface of the contact and the oxide edge is rapidly filled by the tin or any other suitable soldering metal.

It will be understood that the above description of the present invention is suceptible to various modifications changes and adaptations.

What is claimed is:

1. A method for producing a semiconductor arrangement from a semiconductor body covered with an insulating layer provided with windows at desired points of connection to regions in the semiconductor body, said arrangement having conducting paths running on the insulating layer and contacting the regions in the semiconductor body and the conducting paths at certain points being so reinforced by electrolytically deposited metal that the thickened contact parts resulting in this case are suitable for the wire-less contacting of the semiconductor arrangement, comprising: firstly applying a metal layer over said insulating layer provided with windows to cover said insulating layer and said windows; covering the portions of said metal layer corresponding to the desired positions of said conducting paths with a first masking layer, which moveover leaves uncovered the portions of said metal layer to be provided with said thickened contact parts; thereafter covering the entire semiconductor surface, with the exception of the portions to be provided with said reinforced contact parts, with a second masking layer; electrolytically depositing said thickened contact parts on said metal layer at said portions left uncovered by the two masking layers; thereafter removing said second masking layer; subsequently removing said metal layer at the positions not covered by said first masking layer to produce said conducting paths.

2. A method as defined in claim 1, wherein after the production of said conducting paths by partial removal of said metal layer, said first masking layer is removed and the entire surface is covered with a further insulating layer, and wherein connection windows are formed in said further insulating layer at said thickened contact parts.

3. A method as defined in claim 1, wherein said two masking layers comprise photo lacquer layers which are soluble in or removable by different media.

4. A method as defined in claim 3, wherein one of said masking layers comprises negative photo lacquer and the other of said masking layers comprises positive photo lacquer.

5. A method as defined in claim 1, wherein said metal layer comprises a plurality of individual layers arranged one on the other, wherein gold is used as the uppermost individual layer and wherein said thickened contact parts of gold are electrolytically deposited onto said gold layer.

6. A method as defined in claim 5, wherein the lowermost metal individual layer running directly on said insulating layer or on said semiconductor material comprises titanium.

7. A method as defined in claim 6, wherein an intermediate layer of molybdenum, tungsten, palladium or platinum is arranged between said gold layer and said titanium layer.

8. A method of producing contacts and conductive paths for a semiconductor body provided with one or more regions to be contacted comprising: applying an insulating layer defining contact windows for said regions to a surface of said semiconductor body; covering said insulating layer and said windows with a metal layer; forming a first masking layer on said metal layer for covering the portions of said metal layer which are to form conducting paths and leaving exposed undesired portions of said metal layer and portions thereof on which thickened metal contacts for the conductive paths are to be provided; covering said first masking layer and the exposed portions of said metal layer with the exception of said portions on which the thickened metal contacts are to be provided with a second masking layer; electrolytically depositing said thickened metal contacts on the portions of said metal layer left exposed by both said first and second masking layers; thereafter removing said second masking layer; and removing the exposed portions of said metal layer to form said conductive paths.

9. A method as defined in claim 8, further comprising thereafter removing said first masking layer.

10. A method as defined in claim 9, and comprising finally applying an insulating layer to said semiconductor body for defining windows as said thickened metal contact points.

* * * * *